US009972736B2

(12) United States Patent
Koplow et al.

(10) Patent No.: US 9,972,736 B2
(45) Date of Patent: May 15, 2018

(54) SPREADING DEVICES INTO A 2-D MODULE LAYOUT

(71) Applicant: National Technology & Engineering Solutions of Sandia, LLC, Albuquerque, NM (US)

(72) Inventors: Jeffrey P. Koplow, San Ramon, CA (US); Vipin P. Gupta, Reno, NV (US); Gregory N. Nielson, Albuquerque, NM (US); Murat Okandan, Edgewood, NM (US); Jose Luis Cruz-Campa, Albuquerque, NM (US); Jeffrey S. Nelson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 573 days.

(21) Appl. No.: 14/205,839

(22) Filed: Mar. 12, 2014

(65) Prior Publication Data

US 2014/0261616 A1 Sep. 18, 2014

Related U.S. Application Data

(60) Provisional application No. 61/789,299, filed on Mar. 15, 2013.

(51) Int. Cl.
*H01L 31/18* (2006.01)
*H01L 21/68* (2006.01)

(52) U.S. Cl.
CPC ........ *H01L 31/18* (2013.01); *Y10T 29/49133* (2015.01); *Y10T 29/53174* (2015.01); *Y10T 29/53261* (2015.01)

(58) Field of Classification Search
CPC ..... H02S 30/20; H01L 31/1876; H01L 21/68; H01L 21/67132; H01L 21/67754;
(Continued)

(56) References Cited

U.S. PATENT DOCUMENTS 5,022,619 A 6/1991 Mamada
5,357,603 A 10/1994 Parker
(Continued)

FOREIGN PATENT DOCUMENTS

JP 2007053325 A 3/2007
WO WO 2009071790 A1 * 6/2009 ............. H01L 21/68

OTHER PUBLICATIONS

WO 2009/071790A1 English machine translation.*
International Search Report and Written Opinion for PCT/US2014/025872, dated Jul. 17, 2014.

*Primary Examiner* — Jeffrey T Barton
*Assistant Examiner* — Andrew Golden
(74) *Attorney, Agent, or Firm* — Martin I. Finston

(57) ABSTRACT

An apparatus, method, and system, the apparatus including a receiving member dimensioned to receive an array of microelectronic devices; and a linkage member coupled to the receiving member, the linkage member configured to move the receiving member in at least two dimensions so as to modify a spacing between the electronic devices within the array of microelectronic devices received by the receiving member. The method including coupling an array of microelectronic devices to an expansion assembly; and expanding the expansion assembly so as to expand the array of microelectronic devices in at least two directions within a single plane. The system including a support member; an expansion assembly coupled to the support member, the expansion assembly having a plurality of receiving members configured to move in at least two dimensions within a single plane; and a plurality of microelectronic devices coupled to each of the plurality of receiving members.

10 Claims, 13 Drawing Sheets

(58) Field of Classification Search
CPC ........ H01L 21/67766; H01L 21/67005; H05K 13/0015; H05K 13/0023; H05K 13/0046; H05K 13/0413; B25J 9/0078; B25J 9/0233; B25J 9/0286; B66C 1/12; B66C 1/127
USPC .................. 136/243–265, 292; 414/784, 772; 269/299; 294/87.1
See application file for complete search history.

(56) References Cited

U.S. PATENT DOCUMENTS

| | | |
|---|---|---|
| 6,189,591 B1 | 2/2001 | Ariye et al. |
| 6,232,136 B1 * | 5/2001 | Zavracky ............ H01L 21/8221 257/E21.415 |
| 2007/0216892 A1 | 9/2007 | Eidelberg |
| 2010/0233843 A1 * | 9/2010 | Frolov .............. H01L 31/03529 438/98 |
| 2011/0277813 A1 | 11/2011 | Rogers et al. |

* cited by examiner

SPREADING DEVICES INTO A 2-D MODULE LAYOUT

CROSS-REFERENCE TO RELATED APPLICATIONS

The application claims the benefit of the earlier filing date of co-pending U.S. Provisional Patent Application No. 61/789,299, filed Mar. 15, 2013 and incorporated herein by reference.

GOVERNMENT RIGHTS

This invention was developed under Contract DE-AC04-94AL85000 between Sandia Corporation and the U.S. Department of Energy. The U.S. Government has certain rights in this invention.

FIELD OF THE INVENTION

The present invention relates in general to a massively parallel, mechanical system for spreading microelectronic devices, in particular, a system for spreading microelectronic devices in two dimensions. Other embodiments are also described and claimed.

BACKGROUND

The adoption of photovoltaics for generating electricity from sunlight is largely driven by cost considerations. At present, photovoltaic systems are not competitive with fossil-fuel generated electricity. Thus, there is a need to reduce the overall photovoltaic system cost. This entails reducing the costs associated with photovoltaic (PV) solar cell fabrication and assembly of concentrated PV cell modules. In PV module production, the assembly of solar cells into a module is one of the key steps.

For example, where microsystems enabled photovoltaic (MEPV) cells fabricated on 4-12 inch diameter wafers are to be used for concentrated photovoltaic (CPV) applications, the microscale PV cells (or any microscale part on a wafer) needs to be transferred from the two-dimensional (2-D) configuration formed on the wafer, in which the cells are very close together, to a more spread out 2-D layout on a CPV module or substrate. More specifically, the microscale PV cells laid out next to each other on the wafer in an adjacent floor tile configuration with a spacing of, for example, about 10 microns, need to be spread out in the x-y plane to CPV locations that would be 3-10 mm apart from each other, depending on the level of desired incident light concentration. Spreading of the cells, however, which is often carried out using pick-and-place techniques, in which a machine is used to individually pick up, arrange and place each device on the module, is often time consuming and expensive, particularly in the case of smaller cell sizes (e.g., less than 500 microns).

SUMMARY

A method, apparatus and system for massively parallel spreading of microelectronic devices such as microscale PV cells positioned adjacent to each other in two dimensions (e.g., x and y) into a concentrating photovoltaic (CPV) module layout such that each PV cell is a few to many cell dimensions (e.g., 3-10 mm) apart from its neighboring PV cells is disclosed herein.

Representatively, in one embodiment, the apparatus, system and/or method includes an explosive or expansion assembly that utilizes the approximately 10 micron gap between each microscale PV cell and positions a guide wire or ribbon within this gap. The expansion assembly includes linkage bars that have posts around which the wire or ribbon are wrapped and are positioned between the PV cells in an overlapping, grid type formation. For example, in one embodiment, there are a set of x-axis guide wires and a set of y-axis guide wires that are placed around each of the PV cells in an orthogonal configuration. In other embodiments, there are three or more sets of guide wires that are placed around cells in a non-orthogonal configuration in order to accommodate devices of a variety of shapes and sizes. The linkage bars are then rotated in a coordinated manner such that the guide wires that hug the perimeter of each PV cell or other microelectronic device move each cell or device in both the x and y direction to a designated position, e.g., a CPV position. In still further embodiments, the guide wires hug the perimeter of support pads which support the PV cell or other microelectronic device such that movement of the support pads in the x and y directions moves the associated cells or devices in the x and y directions.

In another embodiment, the expansion assembly includes a plurality of device pads interconnected together with linkage members. The device pads are dimensioned to receive the PV cells thereon. The linkage members are, for example, microscale truss members that can expand to spread the pads apart in both the x and y directions and, in turn, spread cells positioned thereon. The array of microscale trusses may be capable of two dimensional expansion in the same xy plane from a contracted position to its fully extended position of 3-10 millimeters. As the microscale pads with the attached PV cells spread outward in the x-y plane, the microscale truss members on the outermost pads extend out fully. Once extended, these pads pull the adjacent pads outward fully extending the remaining truss members. This spreading process continues until all of the expandable trusses are fully extended.

Once the PV cells are spread out into the desired array configuration (e.g., that of a CPV module), the PV cells can be removed from the expansion assembly and transferred to the desired module assembly (e.g., CPV module). The expansion assembly can be contracted back to its original configuration such that it is ready to accept a new set of PV cells.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description. It is further to be understood that in some embodiments, the drawings may not be drawn to scale.

Figure 1:
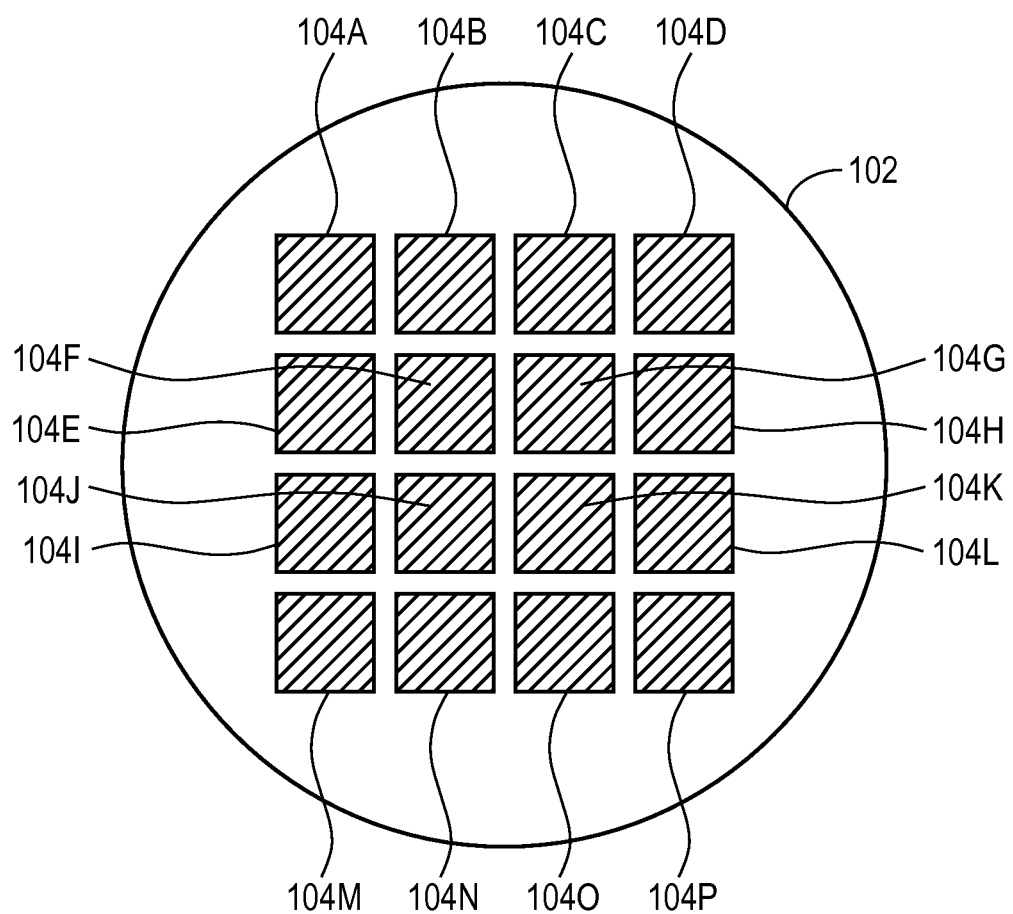
FIG. 1 schematically illustrates a top view of one embodiment of a wafer having an array of microelectronic devices formed thereon.

FIG. 1 schematically illustrates a top view of one embodiment of a wafer having an array of microelectronic devices formed thereon. Representatively, in one embodiment wafer 102 may be a silicon wafer having an array of microelectronic devices 104A, 104B, 104C, 104D, 104E, 104F, 104G, 104H, 104I, 104J, 104K, 104L, 104M, 104N, 104O, 104P fabricated thereon according to any standard processing technique. In some embodiments, the microelectronic devices 104A-104P may be microsystems enabled photovoltaic (MEPV) cells. It should be understood that the terms "photovoltaic solar cell", "photovoltaic cell", "solar cell" and "cell" may be used interchangeably herein to refer to any of microelectronic devices 104A-104P. In addition, it should be understood that although microelectronic devices 104A-104P are described as solar cells herein, they may be any type of microscale or macroscale component formed on a wafer in an array in which one component is substantially adjacent to another. Representatively, microelectronic devices 104A-104P could be detector devices, integrated circuit devices, semiconductor devices or the like.

Microelectronic devices 104A-104P may be, in some embodiments, as small as 10 micrometers across and 1 micrometer thick to 100's of micrometers across and 40-50 micrometers thick, or in some cases up to 1 millimeter thick, devices which are fabricated on wafer 102 with only small, microscale gaps in between each of the devices. Representatively, wafer 102 may be a 4-12 inch diameter wafer and microelectronic devices 104A-104P may be fabricated on wafer 102 in an array in which gaps of less than 100 micrometers, for example, 10 micrometers, are formed in between each of microelectronic devices 104A-104P. As previously discussed, however, for CPV applications, and many other applications, microelectronic devices 104A-104P must be spread apart. For example, where microelectronic devices 104A-104P are PV cells, they must be placed in CPV locations on a CPV substrate such that microelectronic devices 104A-104P are approximately 3-10 millimeters apart from each other. Various mechanisms for massively parallel spreading of microelectronic devices of a variety of shapes and sizes will now be described in reference to FIG. 2-FIG. 15.

Figure 2:
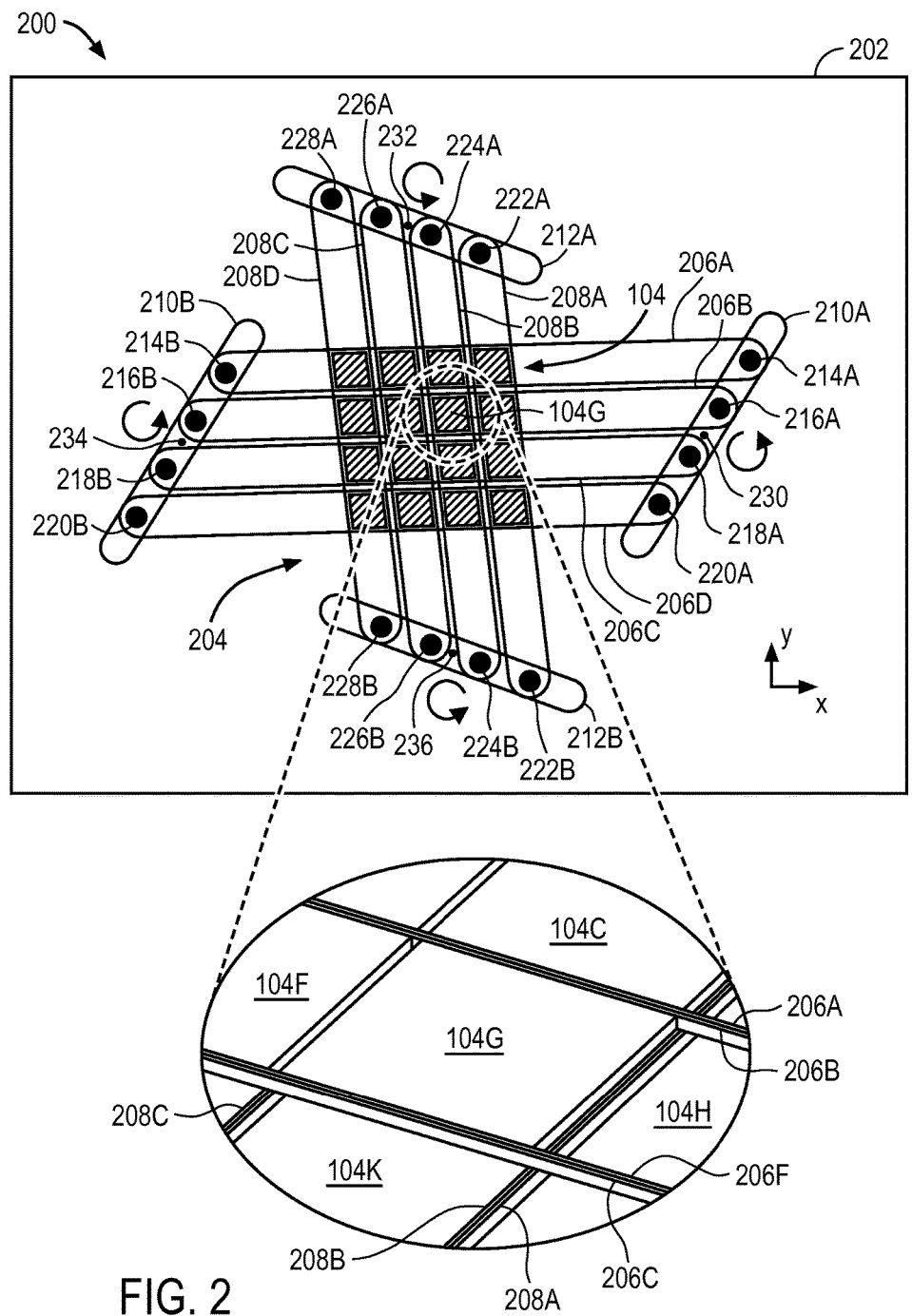
FIG. 2 schematically illustrates a top view of the array of microelectronic devices of FIG. 1 positioned on an expansion assembly in a non-expanded configuration.

FIG. 2 schematically illustrates a top view of the array of microelectronic devices of FIG. 1 positioned on an expansion assembly in a non-expanded configuration. In one embodiment, microelectronic devices 104A-104P may be spread apart using an explosive or expansion assembly 200. It is noted that the terms "explosive" and "expansive" may be used interchangeably herein to describe any of the assemblies, such as assembly 200, herein which are capable of spreading of microelectronic devices into an expanded device array. In one embodiment, expansion assembly 200 is configured to spread the array of microelectronic devices 104A-104P shown in FIG. 1 along at least two dimensions such that a spacing between each of microelectronic devices 104A-104P is increased and a spread out array, which is suitable for use in, for example, CPV applications is formed.

Representatively, in one embodiment, expansion assembly 200 includes a support member 202 upon which the array of microelectronic devices 104A-104P shown in FIG. 1 may be positioned. Support member 202 may be any substantially planar support structure capable of supporting microelectronic devices 104A-104P, for example, a silicon substrate or the like. Microelectronic devices 104A-104P may be transferred to support member 202 according to any standard technique suitable for transferring an array of microscale components from one surface to another without disturbing the array. For example, in one embodiment, a carrier substrate such as an adhesive tape is adhered to the exposed side of microelectronic devices 104A-104P and then used to peel microelectronic devices 104A-104P off of wafer 102. The microelectronic devices 104A-104P are then positioned and placed on support member 202 using the carrier substrate. The carrier substrate can then be removed leaving the array of microelectronic devices 104A-104P on support member 202. For example, in one embodiment, where the carrier substrate is an adhesive tape, the microelectronic devices 104A-104P may be illuminated with ultraviolet (UV) light to deactivate the adhesive and remove the tape.

Alternatively, the entire wafer 102 having microelectronic devices 104A-104P attached thereto may be positioned on support member 202. Each of microelectronic devices 104A-104P may then be spread apart and removed from wafer 102 during the spreading operation as will be discussed in more detail below.

In some embodiments, to ensure smooth movement of microelectronic devices 104A-104P along support member 202, support member 202 may include a coating or other surface modification capable of reducing frictional forces between support member 202 and microelectronic devices 104A-104P. For example, in one embodiment, support member 202 may be coated with a ceramic film lubricant or an inert organic liquid (e.g. diiodomethane at a density of 3.3 g/cc). Alternatively, support member 202 could be made substantially frictionless by incorporation of a porous material hydrostatic bearing surface to support member 202.

Once the array of microelectronic devices 104A-104P are positioned on support member 202, device receiving member 204, which is capable of spreading each of microelectronic devices 104A-104P in at least two dimensions within a single plane, is positioned around each of microelectronic devices 104A-104P. In one embodiment, device receiving member 204 includes a plurality of guide wires 206A, 206B, 206C, 206D, 208A, 208B, 208C and 208D which can be inserted within the microscale gaps formed between each of microelectronic devices 104A-104P. In this aspect, although device receiving member 204 is described as including guide wires, it is contemplated that any elongated microscale structure capable of fitting within a gap formed between microelectronic devices 104A-104P may be used, for example, a ribbon, a rope, a thread, a cable, a bar, or the like.

In other embodiments, guide wires 206A-206D may be positioned around device support pads, which are positioned on receiving member 204 in a desired array. Each of the device support pads may be dimensioned to receive one of microelectronic devices 104A-104P. Microelectronic devices 104A-104P are then positioned on the support pads such that movement of the pads by the guide wires 206A-206D moves the devices 104A-104P positioned thereon in the desired directions.

In one embodiment, guide wires 206A-206D and 208A-208D may be attached at their opposing ends to linkage members 210A, 210B and 212A, 212B, respectively, which are configured to hold and spread each of guide wires 206A-206D and 208A-208D in the desired arrangement. Representatively, in one embodiment, linkage member 210A is a bar having posts 214A, 216A, 218A, 220A dimensioned to secure one end of guide wires 206A, 206B, 206C and 206D, respectively, thereto. Linkage member 210B may also be a bar having posts 214B, 216B, 218B, 220B dimensioned to secure the other end of guide wires 206A, 206B, 206C and 206D, respectively, thereto. In this aspect, each of guide wires 206A-206D may be loops formed by a continuous piece of wire which is looped at one end around posts 214A, 216A, 218A, 220A and the other end around posts 214B, 216B, 218B, 220B. Linkage members 210A and 210B are then spread apart so that each of guide wires 206A-206D are essentially two side by side wires which are parallel to one another as well as to those of the other guide wires 206A-206D.

Similarly, linkage member 212A is a bar having posts 222A, 224A, 226A, 228A dimensioned to secure one end of guide wires 208A, 208B, 208C and 208D, respectively, thereto. Linkage member 212B may also be a bar having posts 222B, 224B, 226B, 228B dimensioned to secure the other end of guide wires 208A, 208B, 208C and 208D, respectively, thereto. In this aspect, each of guide wires 208A-208D may be loops formed by a continuous piece of wire which is looped at one end around posts 222A, 224A, 226A, 228A and the other end around posts 222B, 224B, 226B, 228B. Linkage members 212A and 212B are then spread apart so that each of guide wires 208A-208D are essentially two side by side wires which are parallel to one another as well as to those of the other guide wires 208A-208D. Posts 22A, 224A, 226A, 228A and 222B, 224B, 226B, 228B may have any shape and size, for example an arbitrary shape, that will enable the desired expansion.

It is to be understood, however, that although each of guide wires 206A-206D and 208A-208D are described as being separate looped wires, other types of wire configurations may be used to create a parallel wire configuration as discussed. For example, the guide wires 206A-206D and 208A-208D may be formed by one or more continuous wires which are strung through the associated linkage members much like a tennis racket.

Guide wires 206A-206D and 208A-208D may be orthogonally arranged with respect to one another such that a grid like pattern of wires with openings dimensioned to surround each of microelectronic devices 104A-104P is formed. Representatively, in one embodiment, guide wires 206A-206D form a set of x-axis guide wires and guide wires 208A-208D form a set of y-axis guide wires. Either from above or below the array of microelectronic devices 104A-104P, the y-axis guide wires 208A-208D may be positioned into gaps formed along the y-axis between each of microelectronic devices 104A-104P. Similarly, the x-axis guide wires 206A-206D may be positioned into gaps formed along the x-axis between each of microelectronic devices 104A-104P. Guide wires 206A-206D and 208A-208D may be simultaneously positioned within the device gaps, such as where guide wires 106A-106D and 208A-208D are already arranged on support member 202, or separately such as where guide wires 206A-206D and 208A-208D are separate sets of wires attached to support member 202 after positioning the array of microelectronic devices 104A-104P on support member 202.

A perspective exploded view of the overlapping guide wire configuration with respect to microelectronic device 104G and how the guide wires surround the device is shown in FIG. 1. Although x-axis guide wires 206A-206C are shown positioned over y-axis guide wires 208A-208C in the exploded view, it should be understood that the y-axis guide wires may be placed over the x-axis guide wires. In either case, it is important that each of guide wires 206A-206D and 208A-208D be capable of moving with respect to one another. In addition, it is contemplated that where the wire thickness with respect to the thickness of microelectronic devices 104A-104P is small enough, multiple layers of criss-crossing guide wires could be used to keep the devices in the desired position and prevent the devices from popping out of the plane parallel with the support member 202 during the subsequent spreading operation.

Spreading of microelectronic devices 104A-104P in the x and y axis directions is achieved by spreading guide wires 206A-206D and 208A-208D apart using linkage members 210A, 210B, 212A and 212B. Representatively, in one embodiment, each of linkage members 210A, 210B, 212A and 212B is rotatably attached to support member 202 by pivot members 230, 232, 234, and 236, respectively. Pivot members 230-236 may be any type of attachment mechanism capable of attaching one object to another in a manner which allows the objects to pivot with respect to one another, for example, pins, posts, bolts or the like. Linkage members 210A, 210B, 212A and 212B may be initially attached to pivot members 230-236 in a manner which pulls each of guide wires 206A-206D and 208A-208D together into a contracted configuration as illustrated in FIG. 2. In other words, guide wires 206A-206D and 208A-208D contact one another, or have only a minimal spacing there between, so that guide wires 206A-206D and 208A-208D wrap around and contact each side of microelectronic devices 104A-104P. Representatively, in one embodiment, an orientation of linkage members 210A, 210B, 212A and 212B is non-orthogonal with respect to each of the associated guide wires 206A-206D and 208A-208D such that guide wires 206A-206D and 208A-208D are pulled together into the contracted configuration as shown in FIG. 2.

It is noted that guide wires 206A-206D and 208A-208D may be aligned with and positioned within the gaps of microelectronic devices 104A-104P according to any suitable technique. For example, in one embodiment, an automated optical system may be used to verify that the guide wires are aligned within gaps between microelectronic devices 104A-104P.

Once guide wires 206A-206D and 208A-208D are in position, linkage members 210A, 210B, 212A and 212B are rotated in, for example, a counter-clockwise direction as illustrated by the arrows to spread guide wires 206A-206D and 208A-208D, and in turn, microelectronic devices 104A-104P apart in both the x and y axis directions.

Figure 3:
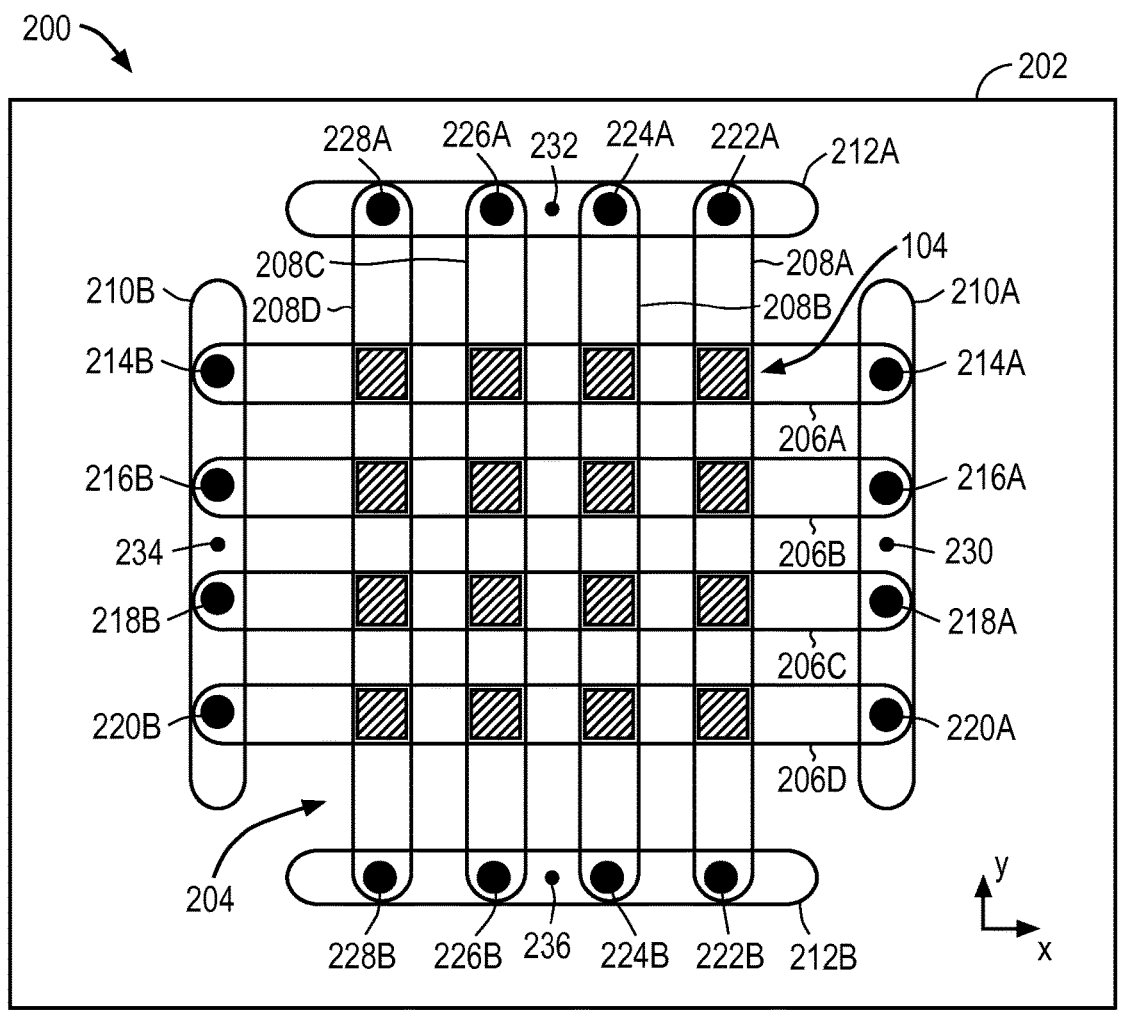
FIG. 3 schematically illustrates a top view of the expansion assembly of FIG. 2 in an expanded configuration.

FIG. 3 schematically illustrates a top view of the expansion assembly of FIG. 2 in the expanded configuration. In particular, as can be seen from FIG. 3, linkage members 210A, 210B, 212A and 212B have been rotated in a counter-clockwise direction such that they are now substantially orthogonal to their respective guide wires 206A-206D and 208A-208D. Rotating linkage members 210A, 210B, 212A and 212B in this manner moves guide wires 206A-206D in the y-direction and 208A-208D in the x-direction such that the microelectronic devices 104A-104P positioned therein are spread out in both the x and y directions thus creating an expanded device array configuration which is suitable for use, for example, in a CPV module. Representatively, in one embodiment, microelectronic devices 104A-104P are spread out from an initial spacing between the devices of 1 length unit (e.g. a width of the device) to a spacing which is about 300 times that or less (e.g. 200 times, 100 times, or 50 times). In other words, a device having a width of, for example, 1 mm, may be spread out from an initial spacing to a spacing of 300 mm. In other embodiments, microelectronic devices 104A-104P are spread out such that an initial spacing of about 15 microns or less between the devices is increased to a spacing of about 30 microns or more, for example, from about 3 mm to 10 mm. It is further to be understood that spreading of microelectronic devices 104A-104P occurs within a single x-y plane, which is parallel to support member 102.

Although a counter-clockwise rotation of linkage members 210A, 210B, 212A and 212B is described, it is contemplated that they may be rotated in any direction suitable for spreading the associated guide wires 206A-206D and 208A-208D. For example, where linkage members 210A, 210B, 212A and 212B start out rotated to the left and down, respectively, in a counter-clockwise direction from that which is shown in FIG. 2, linkage members 210A, 210B, 212A and 212B can be rotated in a clockwise direction to spread guide wires 206A-206D and, in turn, microelectronic devices 104A-104P.

Rotation of linkage members 210A, 210B, 212A and 212B may be driven by any mechanism suitable for rotating each of linkage members 210A, 210B, 212A and 212B at the same rotation magnitude and rate of rotation.

Figure 4:
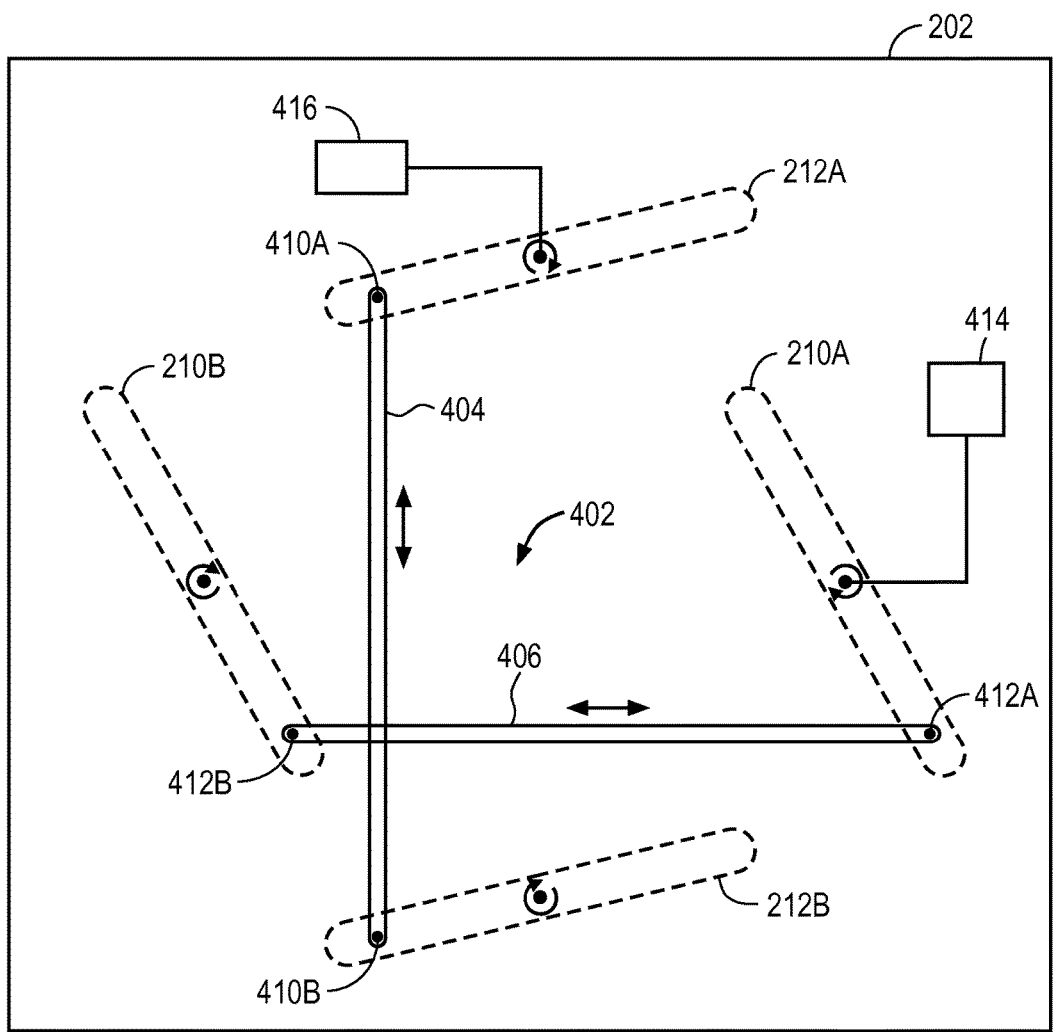
FIG. 4 schematically illustrates a bottom view of the expansion assembly of FIG. 2.

FIG. 4 schematically illustrates a bottom view of the expansion assembly of FIG. 2 including one embodiment of an actuator for driving rotation of linkage members 210A, 210B, 212A and 212B. Representatively, in this embodiment, the actuator includes actuators 414 and 416 (e.g. motors) and a mechanical bar assembly 402 connected to each of linkage members 210A, 210B, 212A and 212B. In particular, actuator 414, for example, a stepper motor, is connected to one of linkage members 210A, 210B, 212A and 212B, for example, linkage member 210A, and actuator 416, for example, a stepper motor, is connected to another of linkage members 210A, 210B, 212A and 212B, for example, linkage member 212A. Activation of actuator 414 drives rotation of linkage member 210A and activation of actuator 416 drives rotation of linkage member 212A. Linkage member 210A is, in turn, coupled to linkage member 210B by mechanical bar assembly 402 and linkage member 212A is coupled to linkage member 212B by mechanical bar assembly 402. In this aspect, rotation of linkage member 210A, simultaneously drives rotation of linkage member 210B and rotation of linkage member 212A simultaneously drives rotation of linkage member 212B. In one embodiment, mechanical bar assembly 402 includes bar member 406 connected at one end to linkage member 210A by pin member 412A and at another end to linkage member 210B by pin member 412B. Mechanical bar assembly 402 further includes bar member 404 connected at one end to linkage member 212A by pin 410A and at another end to linkage member 212B by pin 410B. Each of bar members 404 and 406 may slide with respect to one another and pivot with respect to their associated linkage members such that rotation of linkage member 210A and linkage member 212A in, for example, a counter-clockwise direction, drives rotation of the other linkage members 210B and 212B in the same direction, and at the same rate and magnitude of rotation.

Figure 5:
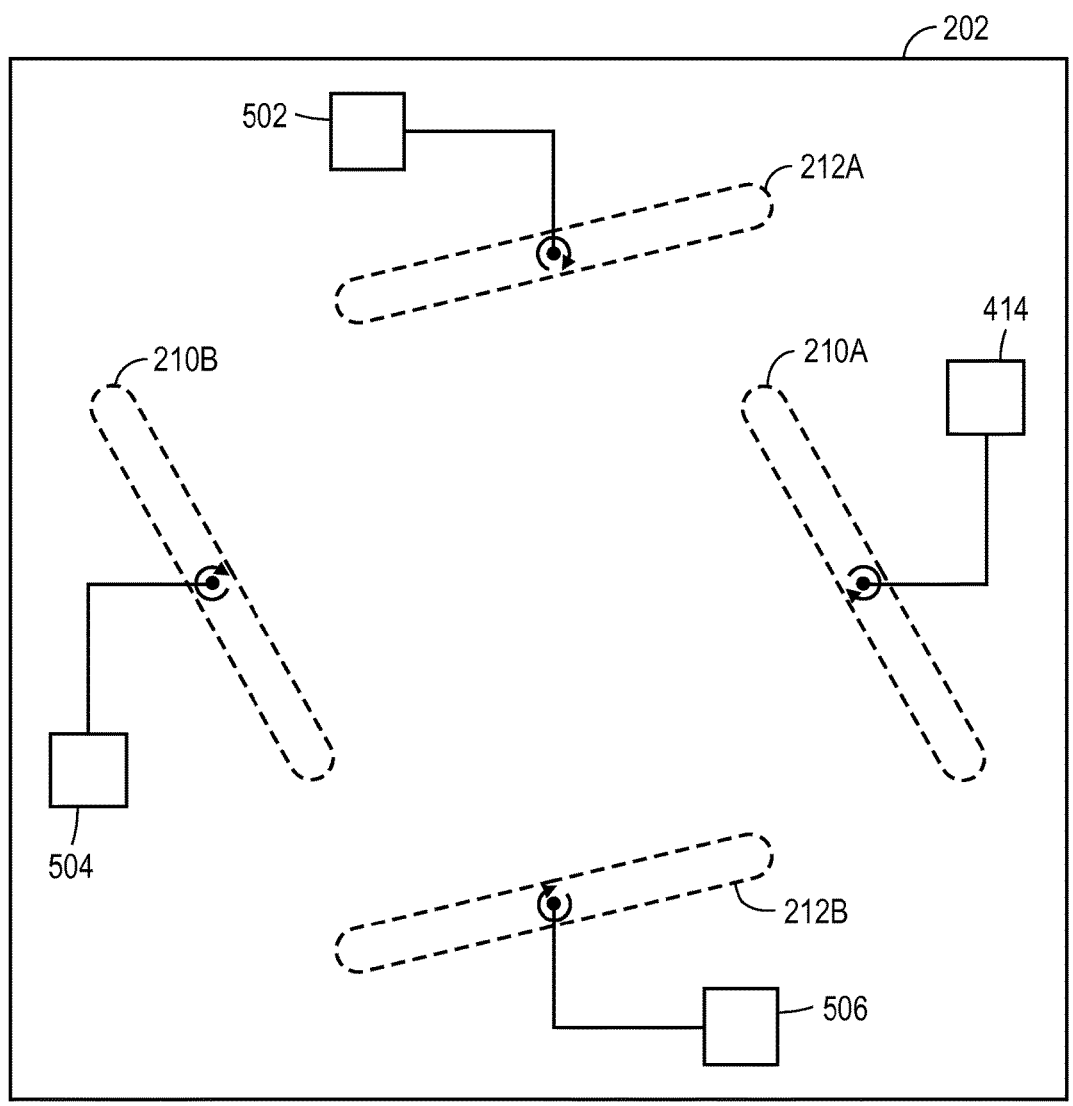
FIG. 5 schematically illustrates a bottom view of the expansion assembly of FIG. 2 according to another embodiment.

FIG. 5 schematically illustrates a bottom view of the expansion assembly of FIG. 2 including another embodiment of an actuator for driving rotation of linkage members 210A, 210B, 212A and 212B. Representatively, in this embodiment, the actuator includes a set of four independent motors 414, 502, 504 and 506 attached to each of linkage members 210A, 210B, 212A and 212B. Motors 414, 502, 504 and 506 may be stepper motors which are synchronized to rotate the four linkage members in unison. Any of the actuator mechanisms described herein may be controlled by, for example, a controller or other system component capable of managing the operation of any of the motor assemblies described herein.

Figure 6:
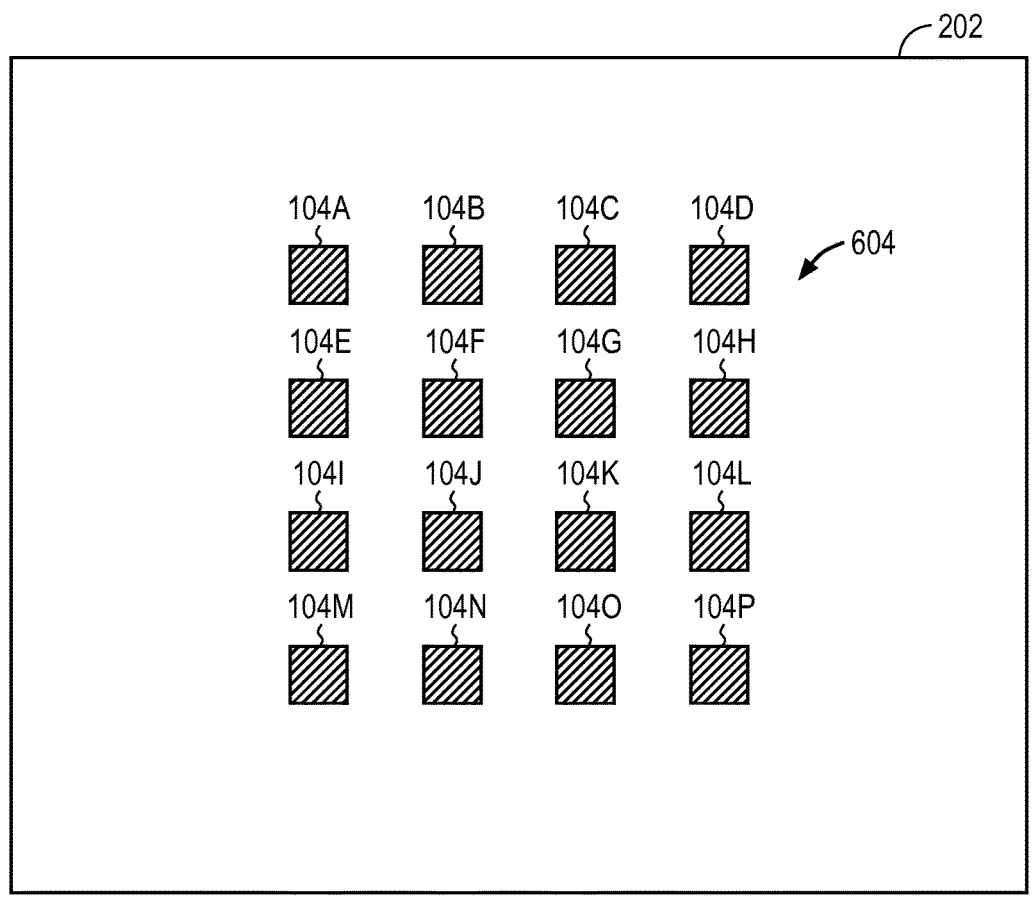
FIG. 6 schematically illustrates a top view of an expanded array of microelectronic devices spread out using the expansion assembly of FIG. 2.

FIG. 6 schematically illustrates a top view of an array of microelectronic devices spread out using the expansion assembly of FIG. 2. Once the microelectronic devices 104A-104P are spread out as previously discussed, receiving member 204 may be removed, such as by lifting each of guide wires 206A-206D and 208A-208D, or lowering support member 202 away from guide wires 206A-206D and 208A-208D. Removal of receiving member 204 leaves behind an expanded array 604 of microelectronic devices 104A-104P as illustrated in FIG. 6. The expanded microelectronic device array 604 is now ready for assembly within a module (CPV module) or other system in which an expanded array of microelectronic devices 104A-104P is desired. For example, in one embodiment where microelectronic devices 104A-104P are PV cells to be used in a CPV module, a CPV interconnected substrate or supersubstrate with solder bumps may be positioned over the expanded microelectronic device array 604. The substrate may then be heated to create the necessary solder bond between each of microelectronic devices 104A-104P and the interconnected substrate. Alternatively, the expanded microelectronic device array 604 may be adhered to a substrate or supersubstrate for use in other microelectronic device applications.

Once microelectronic devices 104A-104P are removed, expansion assembly 200 may be contracted back to the configuration shown in FIG. 2 such that it can receive further device arrays.

Figure 7:
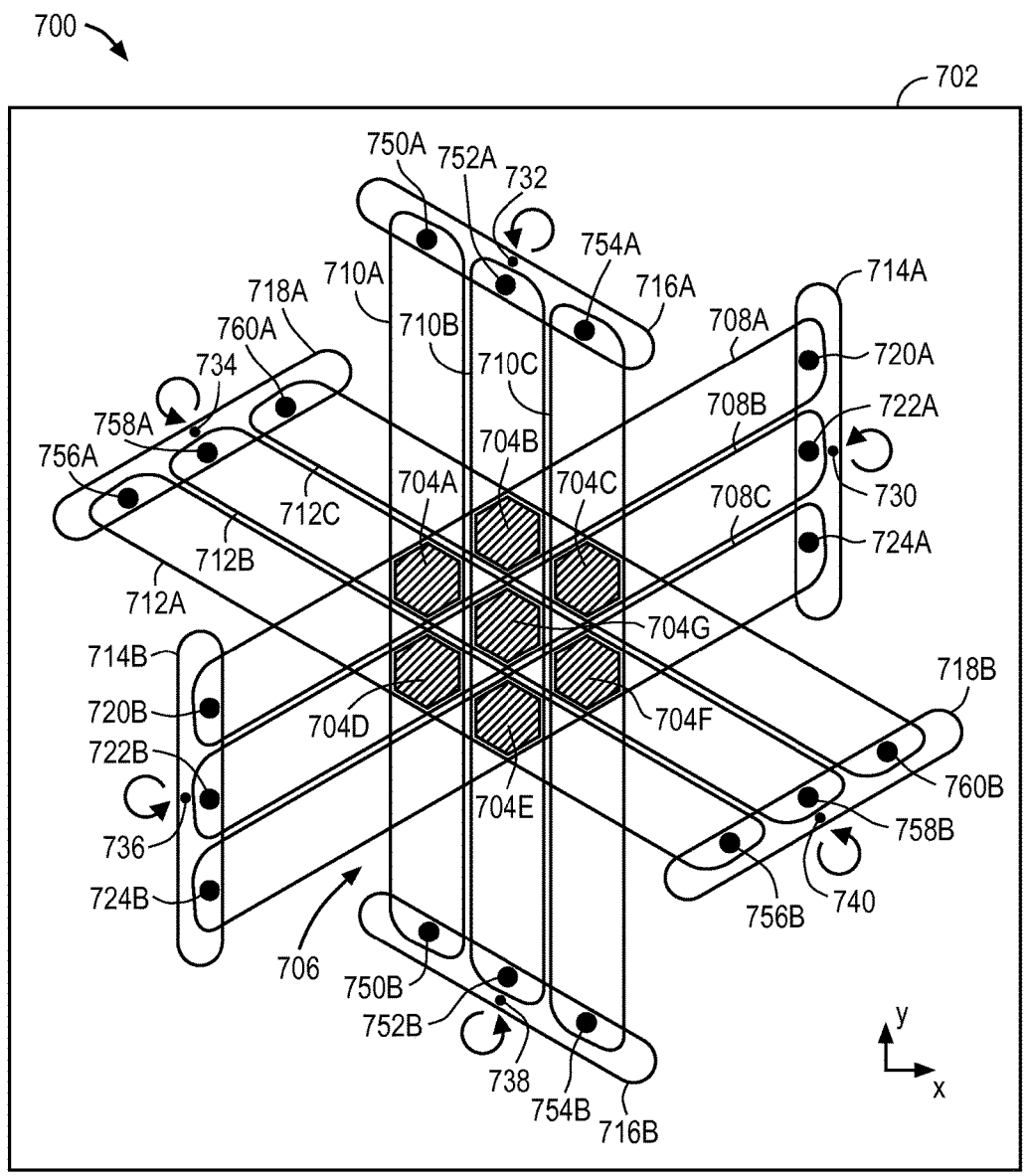
FIG. 7 schematically illustrates a top view of another embodiment of an expansion assembly in a non-expanded configuration.

FIG. 7 schematically illustrates a top view of another embodiment of an expansion assembly in a non-expanded configuration. Expansion assembly 700 is substantially the same as expansion assembly 200 except in this embodiment, expansion assembly is configured to spread apart microelectronic devices having a non-parallelogram shape. In particular, expansion assembly 200 was primarily configured to spread apart parallelogram shaped devices (e.g. square, rectangle, rhombus, etc.). Expansion assembly 700, however, is configured to spread apart non-parallelogram shaped devices, such as polygonal shaped devices (e.g. hexagons, triangles or the like). In this aspect, expansion assembly 700 includes an additional set of guide wires than that of expansion assembly 200 and the guide wires are non-orthogonally arranged with respect to one another to accommodate the angled sides of polygonal shaped devices. It should be understood that although not explicitly discussed in reference to assembly 700, any of the previously discussed features of expansion assembly 200 may further be included in expansion assembly 700 and therefore any which are not explicitly discussed in reference to expansion assembly 700 should be understood as being incorporated into the assembly in a similar manner.

One important consideration with expansion assembly 700 is that with the additional guide wires within expansion assembly 700, expansion assembly 700 becomes kinematically constrained to expand equally and precisely within the plane. This can provide a benefit of maintaining precisely ordered two-dimensional arrays of devices. Such feature may also, in some embodiments, limit the capabilities of the expansion assembly 700 in that it may not be capable of providing a different periodicity in different array axes.

In one embodiment, expansion assembly 700 is configured to spread apart hexagonal shaped microelectronic devices 704A, 704B, 704C, 704D 704E, 704F and 704G. As illustrated in FIG. 7, the array of microelectronic devices 704A-704G are initially placed on support member 702 in a contracted array configuration such that only microscale gaps (e.g. approximately 10 microns) are between each of microelectronic devices 704A-704G. Thus, in order to use microelectronic devices 704A-704G in applications in which a larger spacing is required (e.g. CPV modules), microelectronic devices 704A-704G must be evenly spread apart in both the x and y axis directions.

It is noted that, although not illustrated, a precursor spreading step may be required to position the microelectronic devices 704A-704G in the array configuration illustrated in FIG. 7 in which they are aligned at their corners to create the longitudinal gaps between each of the devices in which guide wires may be inserted. Alternatively, in still further embodiments, microelectronic devices 704A-704G can be fabricated directly on a wafer in the desired array configuration in which longitudinal gaps capable of having guide wires received therein are created.

To accommodate the non-parallelogram shaped microelectronic devices 704A-704G, the expansion assembly 700 includes a receiving member 706 having a first set of guide wires 708A, 708B and 708C, a second set of guide wires 710A, 7108 and 710C and a third set of guide wires 712A, 7128 and 712C. Each of guide wires 708A-708C are attached at opposite ends to linkage members 714A and 714B using posts 720A, 720B, 722A, 722B, 724A and 724B. Each of guide wires 710A-710C are attached at opposite ends to linkage members 716A and 716B using posts 750A, 750B, 752A, 752B, 754A and 754B. Each of guide wires 712A-712C are attached at opposite ends to linkage members 718A and 718B using posts 756A, 756B, 758A, 758B, 760A and 760B.

Guide wires 708A-708C, 710A-710C and 712A-712C may be arranged in a criss-cross type configuration as previously discussed in reference to FIG. 2 except in this embodiment, they are non-orthogonal with respect to one another and form hexagonal openings suitable for positioning around each of microelectronic devices 704A-704G as shown in FIG. 7. It is further to be understood that linkage members 714A, 714B, 716A, 716B, 718A and 718B and guide wires 708A-708C, 710A-710C and 712A-712C are substantially the same, are connected to each other and within assembly 700, and operate in substantially the same manner, as the linkage members discussed in reference to expansion assembly 200 therefore the previous description in reference to such features of assembly 200 should be understood as applying to assembly 700 and will not be repeated herein.

In this embodiment, spreading of microelectronic devices 704A-704G is achieved by spreading guide wires 708A-708C, 710A-710C and 712A-712C apart using linkage members 714A, 714B, 716A, 716B, 718A and 718B. Representatively, each of linkage members 714A, 714B, 716A, 716B, 718A and 718B is rotatably attached to support member 702 at respective pivot members 730, 732, 734, 736, 738 and 740. Pivot members 730, 732, 734, 736, 738 and 740 may be any type of attachment mechanism capable of attaching one object to another in a manner which allows the objects to pivot with respect to one another, for example, pins, posts, bolts or the like. Linkage members 714A, 714B, 716A, 716B, 718A and 718B may be initially attached to pivot members 730, 732, 734, 736, 738 and 740 in a manner which pulls each of guide wires 708A-708C, 710A-710C and 712A-712C together into a contracted configuration as illustrated in FIG. 7. In other words, guide wires 708A-708C, 710A-710C and 712A-712C contact one another, or have only a minimal spacing there between, so that guide 708A-708C, 710A-710C and 712A-712C wrap around and contact each side of microelectronic devices 704A-704G. Representatively, in one embodiment, an orientation of linkage members 714A, 714B, 716A, 716B, 718A and 718B is non-orthogonal with respect to each of the associated guide wires 708A-708C, 710A-710C and 712A-712C such that guide wires 708A-708C, 710A-710C and 712A-712C are pulled together into the contracted configuration as shown in FIG. 7.

It is noted that guide wires 708A-708C, 710A-710C and 712A-712C may be aligned with and positioned within the gaps of microelectronic devices 704A-704G according to any suitable technique. For example, in one embodiment, an automated optical system may be used to verify that the guide wires are aligned within gaps between microelectronic devices 704A-704G.

Once guide wires 708A-708C, 710A-710C and 712A-712C are in position, linkage members 714A, 714B, 716A, 716B, 718A and 718B are rotated in, for example, a counter-clockwise direction as illustrated by the arrows to spread guide wires 708A-708C, 710A-710C and 712A-712C, and in turn, microelectronic devices 704A-704G apart in both the x and y axis directions.

Figure 8:
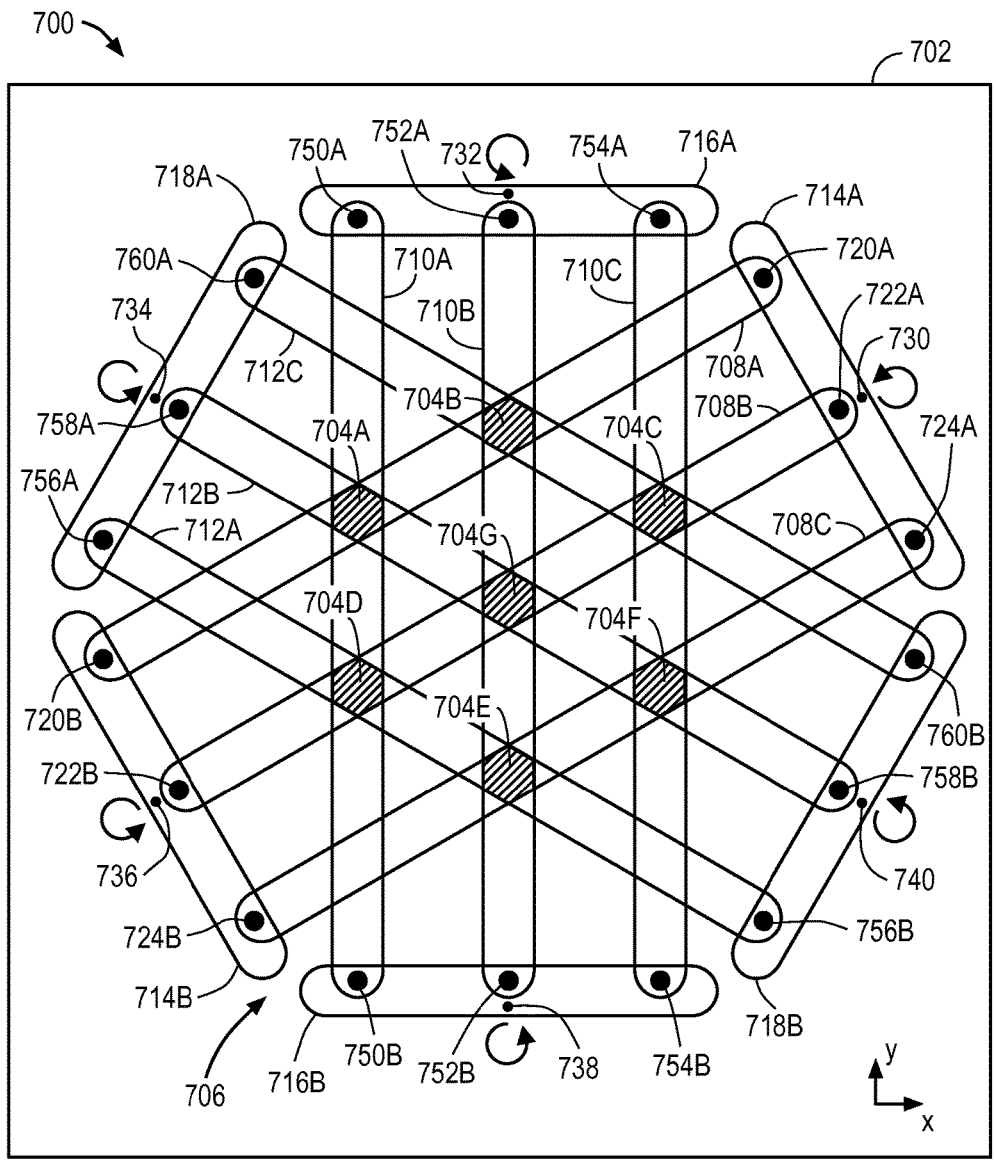
FIG. 8 schematically illustrates a top view of the expansion assembly of FIG. 7 in an expanded configuration.

FIG. 8 schematically illustrates a top view of the expansion assembly of FIG. 7 in the expanded configuration. In particular, as can be seen from FIG. 8, linkage members 714A, 714B, 716A, 716B, 718A and 718B have been rotated in a counter-clockwise direction such that they are now substantially orthogonal to their respective guide wires 708A-708C, 710A-710C and 712A-712C. Rotating linkage members 714A, 714B, 716A, 716B, 718A and 718B in this manner moves guide wires 708A-708C, 710A-710C and 712A-712C with respect to one another such that the microelectronic devices 704A-704G positioned therein are spread out in both the x and y directions thus creating an expanded device array configuration which is suitable for use, for example, in a CPV module. For example in some embodiments, microelectronic devices 704A-704G are spread out such that an initial spacing of about 15 microns or less (e.g. 10 microns) between the devices is increased to a spacing of about 3 mm to 10 mm. It is further to be understood that spreading of microelectronic devices 704A-704G occurs within a single x-y plane, which is parallel to support member 702.

Once microelectronic devices 704A-704G are spread out into the desired expanded array configuration, expansion assembly 700 may be removed leaving microelectronic devices 704A-704G free for any subsequent processing steps (e.g. transfer of microelectronic devices 704A-704G to a PVC module) as previously discussed. Once microelectronic devices 704A-704G are removed, expansion assembly 700 may be contracted back to the configuration shown in FIG. 7 such that it can receive further device arrays.

Figure 9:
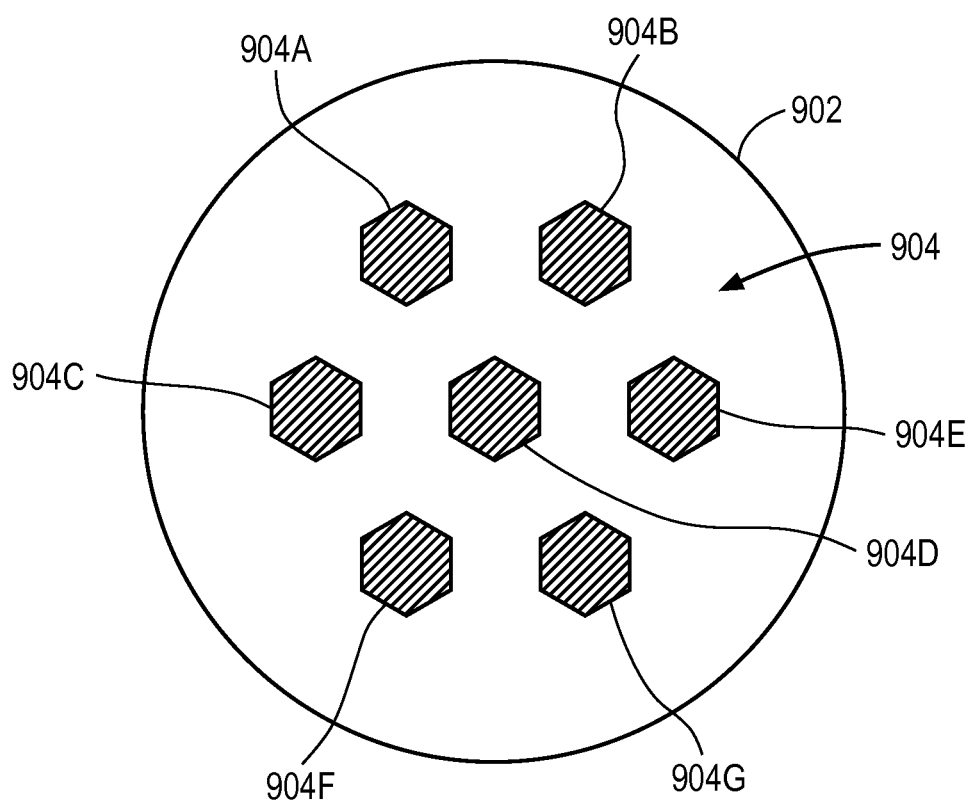
FIG. 9 schematically illustrates a top perspective view of another embodiment of an array of microelectronic devices.

FIG. 9 schematically illustrates a top perspective view of another embodiment of an array of microelectronic devices formed on a wafer. Representatively, in this embodiment, the array of microelectronic devices 904 are shown fabricated on wafer 902 with longitudinal gaps capable of receiving guide wires formed between each of microelectronic devices 904A, 904B, 904C, 904D, 904E, 904F, 904G. The array of microelectronic devices 904 illustrated in FIG. 9 is provided to show another array configuration of polygonal microelectronic devices 904A-904G which can be spread apart using expansion assembly 700.

Figure 10:
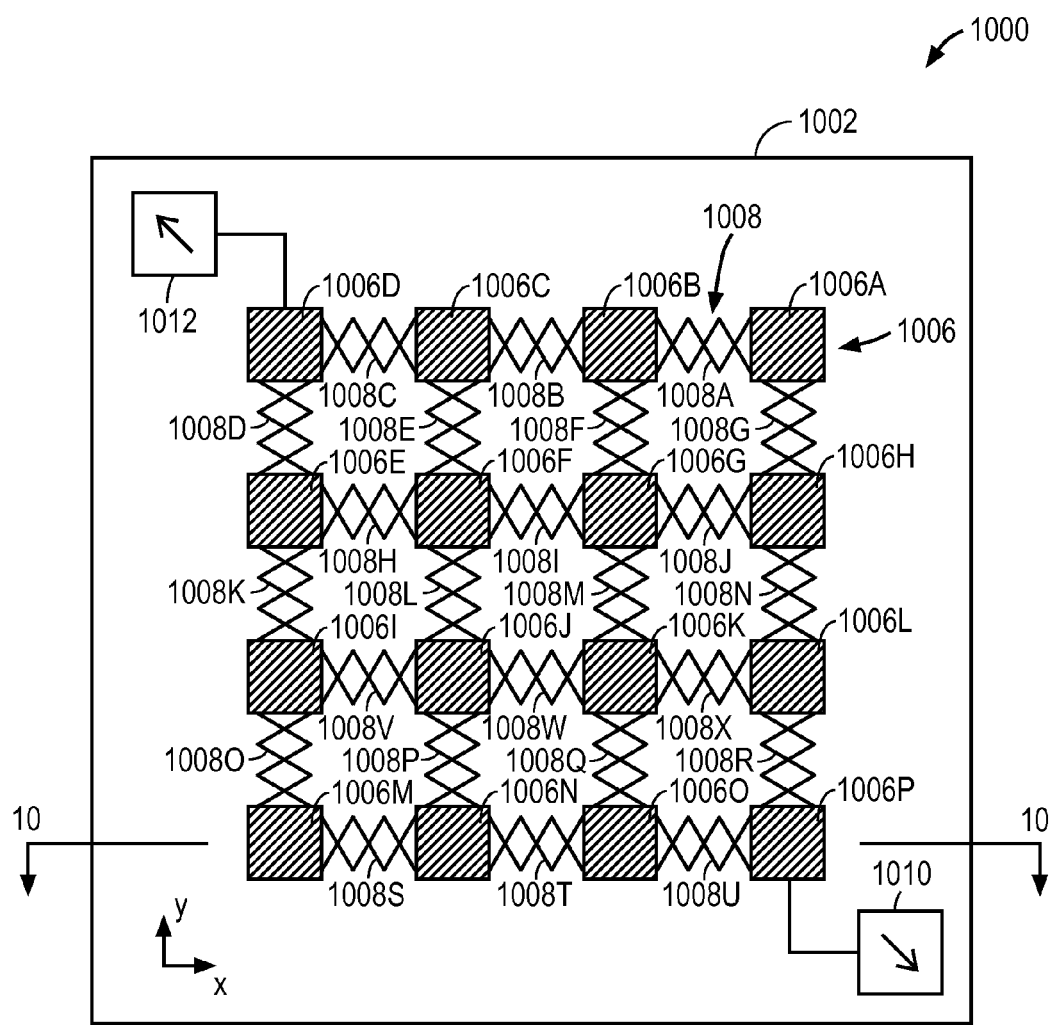
FIG. 10 schematically illustrates another embodiment of an expansion assembly in a non-expanded configuration.

FIG. 10 schematically illustrates another embodiment of an expansion assembly in a non-expanded configuration. In this embodiment, expansion assembly 1000 is configured to expand an array of microelectronic devices in two dimensions, e.g. both an x axis direction and a y axis direction, and within a single plane as the previously discussed expansion assemblies. In this aspect, expansion assembly 1000 includes a support member 1002 having a receiving member 1006 for receiving the microelectronic devices and linkage member 1008 for spreading the devices positioned thereon. Similar to the previously discussed support members, support member 1002 may be any substantially planar structure capable of spreading a microelectronic device array positioned thereon.

In this embodiment, receiving member 1006 may be formed by a plurality of device support pads 1006A-1006P interconnected by linkage member 1008. Linkage member 1008 may include a plurality of expandable members 1008A-1008X which connect each of support pads 1006A-1006P in both the x and y axis directions. Support pads 1006A-1006P may be any type of support structure capable of receiving and supporting a microelectronic device thereon. Representatively, in one embodiment, support pads 1006A-1006P may be substantially planar silicon pads having a sub millimeter size capable of receiving a microelectronic device thereon. For example, support pads 1006A-1006P may have a similar shape and size as the microelectronic device it is designed to support, or they may be smaller or larger than the microelectronic device. Support pads 1006A-1006P may be connected to the ends of respective expandable members 1008A-1008X along their sides or bottom surface according to any suitable technique, e.g. an adhesive, soldering, machining or the like.

In one embodiment, expandable members 1008A-1008X may be microscale, scissor pair, expandable truss structures which are capable of expansion and contraction in response to an applied force. Each of expandable members 1008A-1008X may be two dimensional in the same x-y plane as support pads 1006A-1006P and capable of expanding from their sub-millimeter contracted position (as shown in FIG. 10) to a fully extended position of approximately 2-10 mm. In this aspect, when a force is applied to an outermost expansion member (e.g. expansion member 1008U) the expansion member extends out fully. Once extended, adjacent pads and expandable members are pulled outward until all of the expandable members are fully extended. Representatively, in one embodiment, one or more of actuating mechanisms 1010, 1012 may be connected to one or more of support pads 1006A-1006P or expandable members 1008A-1008X. The actuating mechanisms 1010, 1012 may apply an outward force as illustrated by the arrows to one of pads 1006A-1006P and/or expandable members 1008A-1008X, which expands each of the expandable members 1008A-1008X, and in turn, pads 1006A-1006P in both an x and y axial direction within the same plane. One or more of expandable members 1008A-1008X may be attached to the support member 1002 in any manner that allows for expansion and contraction of expandable members 1008A-1008X as described herein, e.g. on a track type system.

Figure 11:
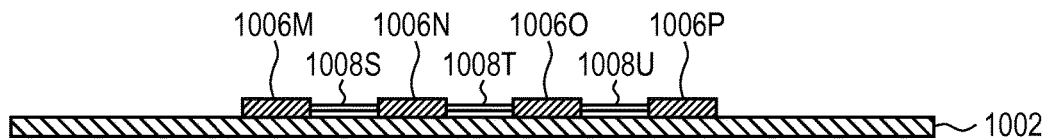
FIG. 11 schematically illustrates a cross sectional side view of the expansion assembly of FIG. 10 along line 10-10'.

FIG. 11 schematically illustrates a cross sectional side view of the expansion assembly of FIG. 10 along line 10-10'. From this view, it can be seen that support pads 1006A-1006P and expandable members 1008A-1008X are interconnected and positioned in a planar configuration on support member 1002. It is to be understood that although only support pads 1006A-1006P and expandable members 1008A-1008X are illustrated in this view, the descriptions provided with respect to these elements further applies to the remaining support pads and expandable members discussed in reference to FIG. 10.

Figure 12:
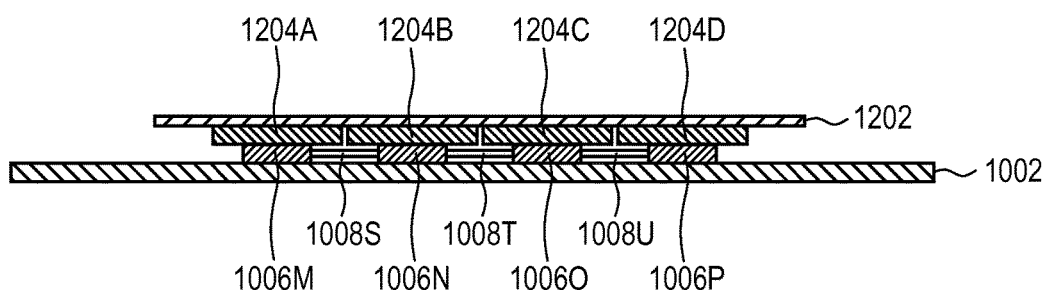
FIG. 12 schematically illustrates a cross sectional side view of the expansion assembly of FIG. 11 with an array of microelectronic devices attached to a carrier member positioned thereon.

FIG. 12 schematically illustrates a cross sectional side view of the expansion assembly of FIG. 11 with an array of microelectronic devices attached to a carrier member positioned thereon. Carrier member 1202 may be any type of carrier member (e.g. an adhesive tape) suitable for transporting and positioning one or more of microelectronic devices 1204A-1204D onto support pads 1006M-1006P as shown. Microelectronic devices 1204A-1204D may be any of the previously discussed types of devices (e.g. PV cells) which are formed in an array which needs to be spread apart prior to assembly in the desired application (e.g. CPV module).

Figure 13:
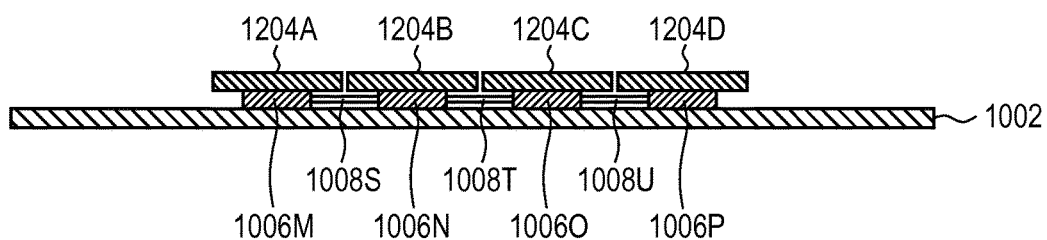
FIG. 13 schematically illustrates a cross sectional side view of the expansion assembly of FIG. 12 with the carrier member removed.

FIG. 13 schematically illustrates a cross sectional side view of the expansion assembly of FIG. 12 with the carrier member removed. Once microelectronic devices 1204A-1204D are positioned on support pads 1006M-1006P, carrier member 1202 may be removed as illustrated in FIG. 13. In one embodiment, carrier member 1202 may be removed, for example, by applying a UV light source which deactivates an adhesive used to hold microelectronic devices 1204A-1204D to carrier member 1202. In addition, each of support pads 1006M-1006P may include an adhesive or the like which facilitates attachment of microelectronic devices 1204A-1204D thereto once carrier member 1202 is removed.

Figure 14:
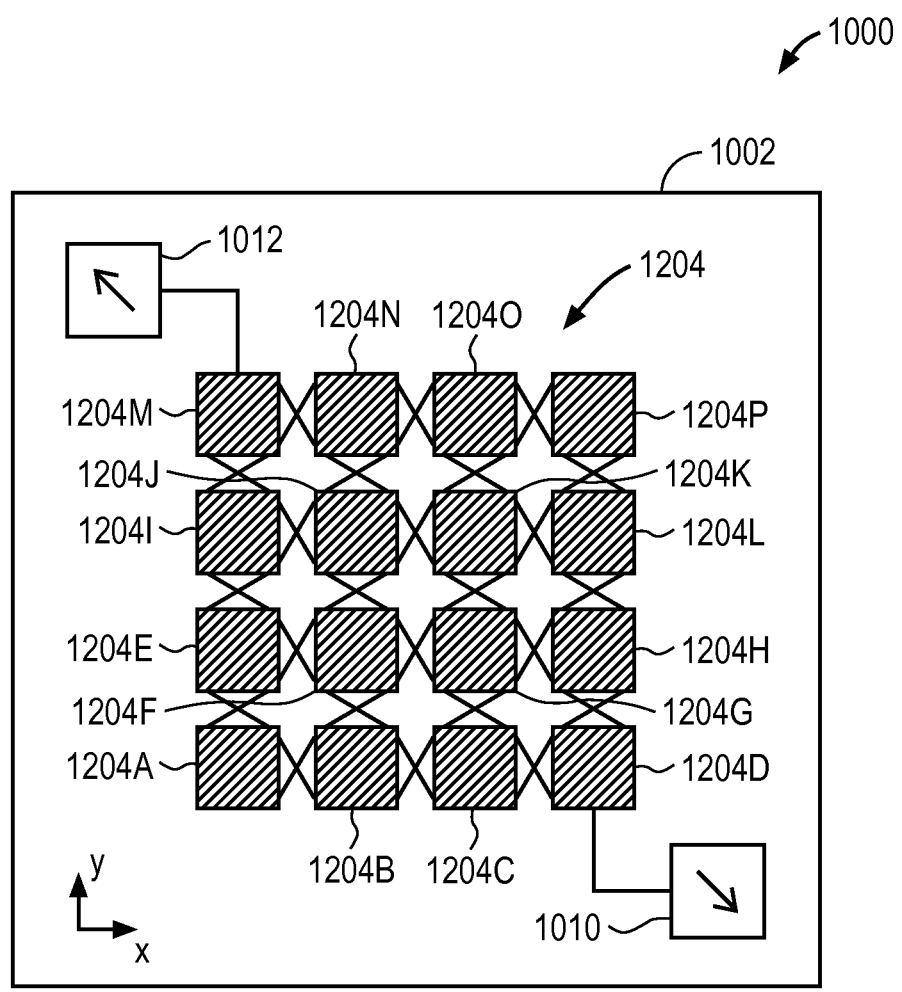
FIG. 14 schematically illustrates a top view of the expansion assembly of FIG. 13 having the microelectronic devices attached thereto in a non-expanded configuration.
Figure 15:
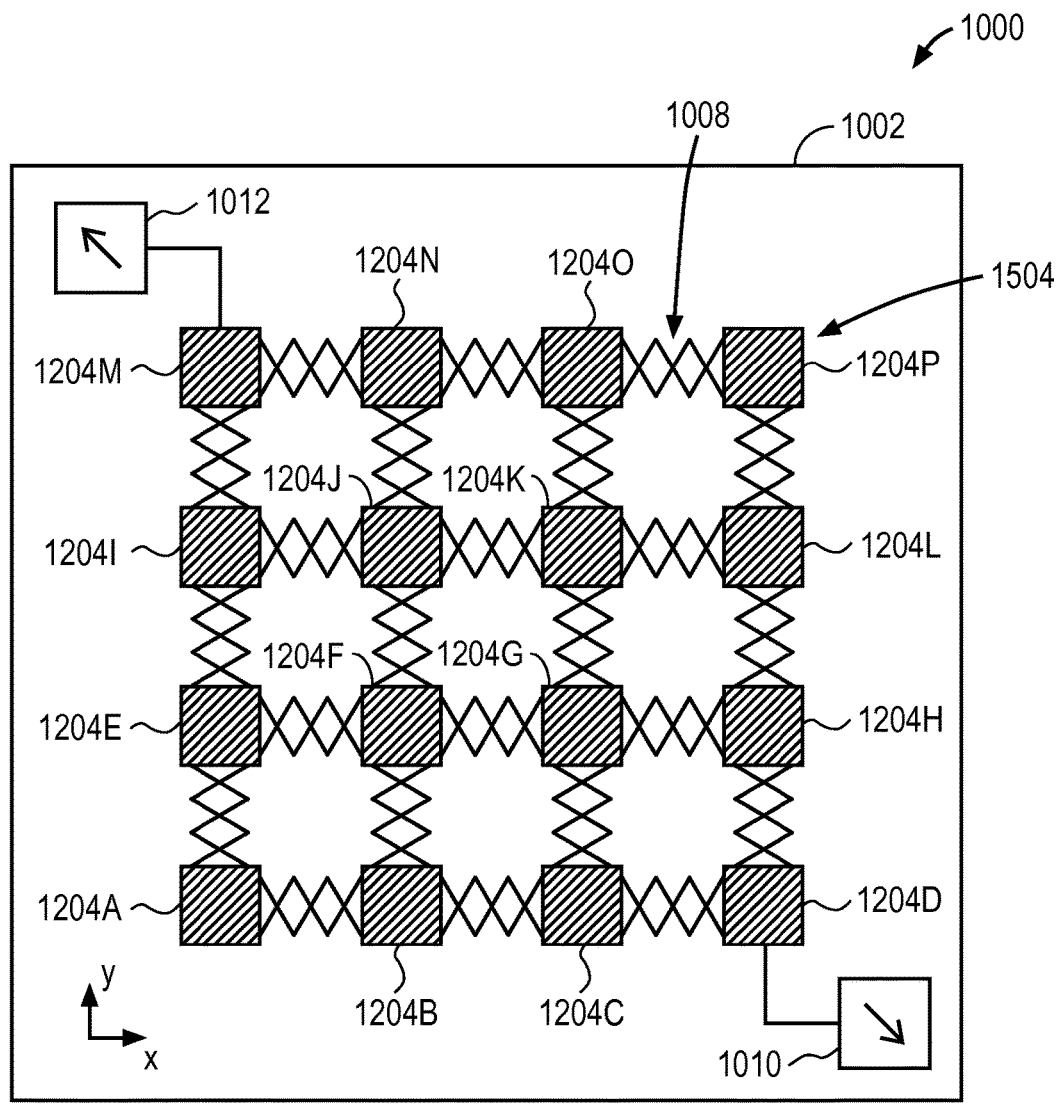
FIG. 15 schematically illustrates a top view of the expansion assembly of FIG. 14 having the microelectronic devices attached thereto in an expanded configuration.

FIG. 14 schematically illustrates a top view of the expansion assembly of FIG. 13 having the microelectronic devices attached thereto in a non-expanded configuration. Once the array of microelectronic devices 1204, namely microelectronic devices 1204A-1204P, are attached to respective ones of the support pads 1006A-1006P as shown in FIG. 14, actuating mechanisms 1010, 1012 can be used to expand the array into an expanded array configuration 1504 as shown in FIG. 15. In particular, as can be seen from FIG. 15, each of the expansion members 1008 are fully expanded thus increasing a spacing between each of the microelectronic devices to form an expanded array of microelectronic devices 1504 which is suitable for use in other applications (e.g. a CPV module). For example, in one embodiment, the expanded array of microelectronic devices 1504 may be transferred to a temporary superstrate and then placed onto a CPV interconnected substrate.

It is to be understood that although expansion assembly 1000 is shown used in connection with substantially parallelogram shaped (e.g. square shaped) microelectronic devices, expansion assembly 1000 can be used with any shape of device, for example, polygonal devices, circular devices, elliptical devices, or the like. Thus, it is further to be understood that the number of guide wires and/or support pads for receiving the microelectronic devices may vary depending upon the size, shape and number of microelectronic devices making up the device array.

In addition, it is to be understood that any of the above-discussed expansion assemblies, depending upon the shape of the device, can be used to achieve a 100% packing fill factor or close to a 100% fill factor in the module in which they are assembled on (e.g. CPV module). In other words the devices can cover approximately 100% of the module area, or close to 100% of the module area.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the expansion assemblies disclosed herein are described in connection with expansion of parallelogram and polygon shaped microelectronic devices, it is contemplated that other shaped devices may be spread using the assemblies disclosed herein. Representatively, the expansion assemblies may be used to spread devices having any shape and size capable of being received within the receiving members, for example, circular, elliptical or the like shaped devices. Moreover, although expansion assemblies for spreading devices such as PV cells are described herein, it is contemplated that the devices need not be limited to such devices. Rather, electronic devices or components of any size which could benefit from an expansion assembly as disclosed herein are contemplated. For example, other types of suitable devices may include, but are not limited to, DIACs, diodes (rectifier diode), gunn diodes, IMPATT diodes, laser diodes, light-emitting diodes (LED), photo-cells, PIN diodes, schottky diodes, tunnel diodes, VCSELs, VECSELs, zener diodes, bipolar transistors, darlington transistors, field-effect transistors, insulated-gate bipolar transistor (IGBT)s, silicon controlled rectifiers, thyristors, TRI-ACs, unijunction transistors, hall effect sensors (magnetic field sensor), integrated circuits (ICs), charge-coupled devices (CCD), microprocessor devices, random-access memory (RAM) devices, or read-only memory (ROM) devices. The description is thus to be regarded as illustrative instead of limiting.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention. The description is thus to be regarded as illustrative instead of limiting.

What is claimed is:

1. An apparatus comprising:
   a receiving member dimensioned to receive an array of electronic devices; and
   a mechanical linkage coupled to the receiving member, the mechanical linkage configured to move the receiving member in at least two horizontal dimensions so as to modify a spacing between the electronic devices within the array of electronic devices received by the receiving member, wherein:
   the mechanical linkage comprises a plurality of linkage members;
   the receiving member comprises a plurality of guide wires disposed in the form of a grid;
   the grid comprises at least a first set and a second set of parallel guide wires;
   the first set of parallel guide wires overlaps at least the second set of parallel guide wires;

a first subset of the plurality of linkage members contacts the first set of parallel guide wires and spaces the guide wires of said first set apart from each other;

a second subset of the plurality of linkage members contacts the second set of parallel guide wires and spaces the guide wires of said second set apart from each other;

the linkage members of the first said subset are rotatable in a horizontal plane;

the linkage members of the second said subset are rotatable in the horizontal plane;

the wires of said first set of parallel guide wires are displaceable in a horizontal plane relative to the wires of said second set of parallel guide wires;

the mechanical linkage is configured to modify a spacing in the horizontal plane between the parallel guide wires of each respective set of parallel guide wires;

the spacing in the horizontal plane between the parallel guide wires of the first set of parallel guide wires is modified by movement of the first said subset of linkage members; and the spacing in the horizontal plane between the parallel guide wires of the second set of parallel guide wires is modified by movement of the second said subset of linkage members.

2. The apparatus of claim 1 wherein the plurality of guide wires comprised by the receiving member is dimensioned to surround each of the electronic devices within the array of electronic devices.

3. The apparatus of claim 2 wherein the plurality of guide wires comprised by the receiving member are attached to the mechanical linkage.

4. The apparatus of claim 2 wherein the plurality of guide wires comprised by the receiving member comprise a set of x-axis guide wires that are positioned across a set of y-axis guide wires to form an orthogonal arrangement of x-axis guide wires and y-axis guide wires capable of surrounding each of the electronic devices.

5. The apparatus of claim 2 wherein the plurality of guide wires comprised by the receiving member overlap one another according to a non-orthogonal arrangement.

6. The apparatus of claim 1 wherein the mechanical linkage comprises a plurality of bar members, and wherein rotation of the bar members moves the receiving member in the at least two dimensions.

7. The apparatus of claim 1 wherein the receiving member comprises a plurality of device pads configured to receive each of the electronic devices within the array of electronic devices.

8. The apparatus of claim 1 wherein the mechanical linkage is configured to increase an initial spacing between the parallel guide wires of each respective set of parallel guide wires to a final spacing that is larger than the initial spacing by an expansion factor, which is equal to the final spacing divided by the initial spacing, in the range 50-300.

9. The apparatus of claim 1 wherein the electronic devices are one of microelectronic devices or photovoltaic cells.

10. The apparatus of claim 1, wherein the array of electronic devices comprises a plurality of photovoltaic (PV) cells, the receiving member is adapted to receive the plurality of PV cells in a first array configuration, and the mechanical linkage is operable to spread out the plurality of PV cells from the first array configuration into a second array configuration corresponding to a PV module layout.

* * * * *